(12) United States Patent
Ploix et al.

(10) Patent No.: US 9,184,581 B2
(45) Date of Patent: Nov. 10, 2015

(54) DEVICE AND METHOD FOR ESTIMATING A TOUCH CURRENT AND PROTECTING AN ELECTRICAL APPARATUS AGAINST SUCH TOUCH CURRENTS

(75) Inventors: Olivier Ploix, Villiers Saint Frederic (FR); Christophe Ripoll, Chevreuse (FR)

(73) Assignee: RENAULT s.a.s., Boulogne-Billancourt (FR)

( * ) Notice: Subject to any disclaimer, the term of this patent is extended or adjusted under 35 U.S.C. 154(b) by 297 days.

(21) Appl. No.: 13/880,848

(22) PCT Filed: Oct. 14, 2011

(86) PCT No.: PCT/EP2011/068022
§ 371 (c)(1),
(2), (4) Date: Jul. 24, 2013

(87) PCT Pub. No.: WO2012/052366
PCT Pub. Date: Apr. 26, 2012

(65) Prior Publication Data
US 2013/0301168 A1    Nov. 14, 2013

(30) Foreign Application Priority Data

Oct. 21, 2010    (FR) ..................................... 10 58615

(51) Int. Cl.
*H02H 3/00*    (2006.01)
*H02H 3/16*    (2006.01)
(Continued)

(52) U.S. Cl.
CPC .. *H02H 3/16* (2013.01); *B60L 3/00* (2013.01); *G01R 31/006* (2013.01); *G01R 31/025* (2013.01)

(58) Field of Classification Search
CPC ..................................................... H02H 1/0015
USPC ........................................................... 361/42
See application file for complete search history.

(56) References Cited

U.S. PATENT DOCUMENTS

| 5,245,495 A | 9/1993 | Bailey et al. |
| 6,388,451 B1 * | 5/2002 | Burba et al. .................. 324/522 |

(Continued)

FOREIGN PATENT DOCUMENTS

| DE | 10 2004 057 694 | 6/2006 |
| EP | 2 233 344 | 9/2010 |

(Continued)

OTHER PUBLICATIONS

International Search Report Issued Dec. 29, 2011 in PCT/EP11/68022 Filed Oct. 14, 2011.

*Primary Examiner* — Stephen W Jackson
(74) *Attorney, Agent, or Firm* — Oblon, McClelland, Maier & Neustadt, L.L.P.

(57) ABSTRACT

A device and method for protection of an electrical apparatus against touch currents, the device configured to be connected between a source of electrical power and a device onboard a motor vehicle, and including a circuit for detecting leakage currents and for estimating touch currents, configured to be connected to the electrical connection lines of the apparatus, a circuit measuring frame current, and a mechanism controlling operation of the apparatus according to the estimated level of the touch currents and the measured level of the frame current. The device and method can in one embodiment be used to protect against leakage currents during recharging of a hybrid or electrically driven motor vehicle.

15 Claims, 2 Drawing Sheets

(51) Int. Cl.
  *B60L 3/00* (2006.01)
  *G01R 31/00* (2006.01)
  *G01R 31/02* (2006.01)

(56) References Cited

U.S. PATENT DOCUMENTS

| | | | |
|---|---|---|---|
| 7,944,068 B2 * | 5/2011 | Wagoner et al. | 290/44 |
| 2008/0073135 A1 | 3/2008 | Oyobe et al. | |
| 2009/0015973 A1 | 1/2009 | Trunk et al. | |
| 2010/0253145 A1 | 10/2010 | King et al. | |
| 2010/0270860 A1 | 10/2010 | Kamaga | |
| 2011/0175442 A1 | 7/2011 | King et al. | |

FOREIGN PATENT DOCUMENTS

| | | |
|---|---|---|
| EP | 2 236 344 | 10/2010 |
| FR | 2 701 176 | 8/1994 |
| JP | 11 205909 | 7/1999 |
| WO | 2006 035959 | 4/2006 |

* cited by examiner

DEVICE AND METHOD FOR ESTIMATING A TOUCH CURRENT AND PROTECTING AN ELECTRICAL APPARATUS AGAINST SUCH TOUCH CURRENTS

The invention relates to the protection of electrical apparatus against leakage currents and more particularly the protection of battery chargers of electrical vehicles against the leakage currents likely to occur when the charger is connected to an electrical power distribution network.

The chargers used in certain electrical motor vehicles are not isolated. Each element of the charger has a common-mode capacitance relative to the chassis. During connection to an electrical power distribution network, the voltages applied to these various elements will cause, through these capacitances, ground leakage currents.

These ground leakage currents may, when they occur, initiate differential protections of residual current capable of interrupting the charging process.

If a user touches the bodywork of the electrical vehicle during charging, the ground leakage currents become currents called "touch" or "contact" currents, if there is a defect of grounding of the vehicle. These touch currents are limited by the international standard 61851-21 to 3.5 mA.

For the purpose of limiting these currents, it has been proposed to use a transformer creating a galvanic isolation between the distribution network and the battery.

The transformers used are bulky elements the size of which increases with the charging power or with the current passing through them. The drawback of this solution is therefore that it leads to an additional cost and an increase in the volume of the device which greatly penalizes the electrical motor vehicle.

Moreover, it is possible to connect the existing chargers to single-phase or three-phase networks in order to obtain a higher charging power. During a connection to a three-phase network, the stresses on the transformers used are therefore increased.

It has also been proposed to redirect the leakage currents to the neutral of the electrical network, for example by means of a capacitor connected between the bodywork of the electrical vehicle and neutral.

The current-limitation solutions have the drawback of not being able to take account of an increase in the leakage currents. Such an increase may arise from an increase in the interference capacitance or from a defect of the compensation system. The leakage-current limitation systems can therefore not keep a touch current on the chassis of below than 3.5 mA.

In the light of the forgoing, the object of the invention is to provide an estimation of the touch currents and to protect the electrical vehicle during variations in the touch currents.

Another object of the invention is to keep the value of the touch currents below a predefined limit value.

According to a first aspect, the invention thus proposes a device for protecting an electrical apparatus against touch currents, said apparatus being designed to be connected between an electrical power source and an item of equipment on board a motor vehicle.

This device comprises a circuit for detecting leakage currents and for estimating touch currents, designed to be connected to electrical connection lines of the apparatus, a circuit for measuring the ground current, and means for controlling the operation of the apparatus according to the estimated level of the touch currents and to the measured level of the ground current.

Therefore, the control means make it possible to allow or prevent the supplying of electrical power if high leakage currents occur or leakage currents disappear.

Advantageously, the source of electrical power may be a three-phase or single-phase power supply network.

The electrical apparatus may be a charger for a battery on board the motor vehicle, the electrical motor vehicle being a motor vehicle with electrical or hybrid drive.

According to another aspect, the invention proposes a method for protecting an electrical apparatus against touch currents, said apparatus being designed to be connected between an electrical power source and an item of equipment on board a motor vehicle.

According to a general feature of the method, the method comprises a detection of the leakage currents, an estimation of the touch currents, a measurement of the ground current, and a control of the operation of the apparatus according to the estimated level of the touch currents and to the measured level of the ground current.

Advantageously, the electrical apparatus is connected to the electrical power source and supplying the onboard equipment with electrical power is prevented according to the estimated level of the touch currents and to the measured level of the ground current.

Therefore, the onboard equipment is not automatically supplied during the connection.

If the measured ground current is below a first defined threshold value, supplying the onboard equipment with electrical power is prevented.

Too weak a ground current may indicate a defect in the ground connection, so it is necessary to prevent the onboard equipment being supplied with electrical power.

If the measured ground current is above a second defined threshold value, supplying the onboard equipment with electrical power is allowed.

If the estimation of the touch currents is below a third defined threshold value, supplying the onboard equipment with electrical power is allowed.

If the estimation of the touch currents is above a fourth defined threshold value, supplying the onboard equipment with electrical power is prevented.

Other advantages and features of the invention will appear on studying the following description, taken as a nonlimiting example and illustrated by the appended drawings in which:

FIG. 1 shows the principle of the generation of leakage currents in an electrical vehicle to which a battery charger that is not galvanically isolated is connected.

Figure 1:
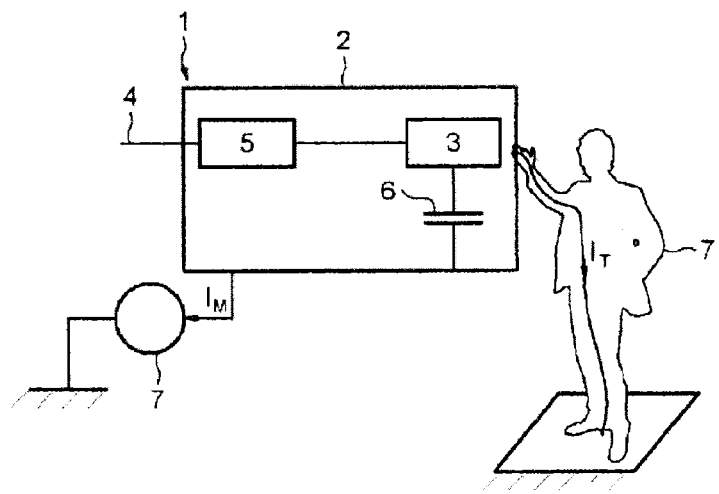
FIG. 1 shows schematically the general principle of protection against leakage currents according to the invention.

It will be noted however that this principle applies to any type of apparatus, of the battery charger or other type, notably for a motor vehicle with an electrical or hybrid drive system in which touch currents are capable of occurring after connection of the apparatus when a person touches the bodywork of the vehicle.

In this figure, the reference number 1 indicates the vehicle in its entirety and reference number 2 indicates an electrically conductive structure of the vehicle, in this instance the bodywork of the vehicle.

As shown, the electrical motor vehicle 1 is in this instance furnished with a charger 3 and moreover comprises a set of batteries and an electrical drive system that are not shown in this figure.

Naturally, the vehicle 1 may also be fitted with many additional members that have not been shown in the figure for reasons of simplification.

The charger 3 is connected to the power supply network via an electrical connection 4. The electrical connection 4 may comprise several phases. A protective device 5 of the charger 3 is placed on the electrical connection 4.

When the charger 3 is connected to an electrical network, an interference capacitor 6 creates a leakage current between the charger 3 and the structure 2.

If a user 7 touches the bodywork of the vehicle 2, the latter is traversed by a touch current $I_T$ created through the interference capacitor 6.

The leakage current also produces a ground current $I_M$.

The protective device 5 makes it possible to detect the occurrence of leakage currents and to control the charger 3 notably according to the leakage currents.

Figure 2:
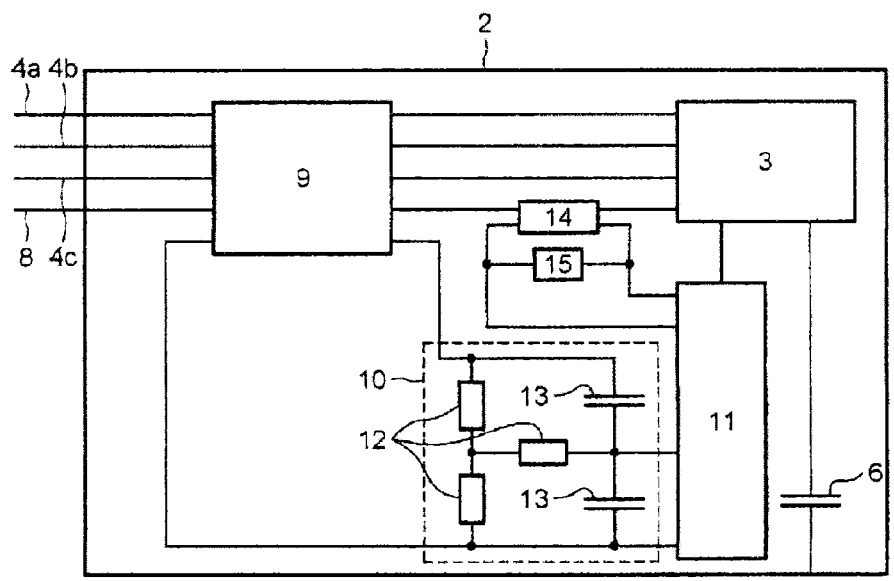
FIG. 2 illustrates an embodiment of a device according to the invention.

FIG. 2, which shows the detail of the architecture of the protective device 5, illustrates a vehicle 1 comprising three electrical connections 4a, 4b and 4c connecting the vehicle to a three-phase or a single-phase network, and a ground connection 8.

The protective device 5 comprises a leakage-current detection and touch-current estimation circuit 9 comprising current-measuring means advantageously chosen to detect the intensities to be measured across the phases 4a, 4b, 4c and the ground connection 8.

The circuit 9 provides an estimate according to the current that enters the charger 3.

The circuit 9 may consist of a measurement of electromagnetic flow through a measuring torroid comprising the phases and ground.

This circuit 9 may also comprise means for computing the measurement difference between the ground current and the leakage current. The measurement of the leakage current comprises the measurement of the leakage current of the three phases.

A matching circuit 10 then makes it possible to adapt the output of the touch current estimating circuit 9 in order to reach a processing unit 11. The matching circuit 10 comprises a set of three resistors 12 and two capacitors 13.

The processing unit 11 comprises means for controlling the charger 3.

A circuit 14 for measuring the ground currents is placed on the ground connection 8. This circuit 14 is connected via a resistor 15 to the processing unit 11.

Figure 3:
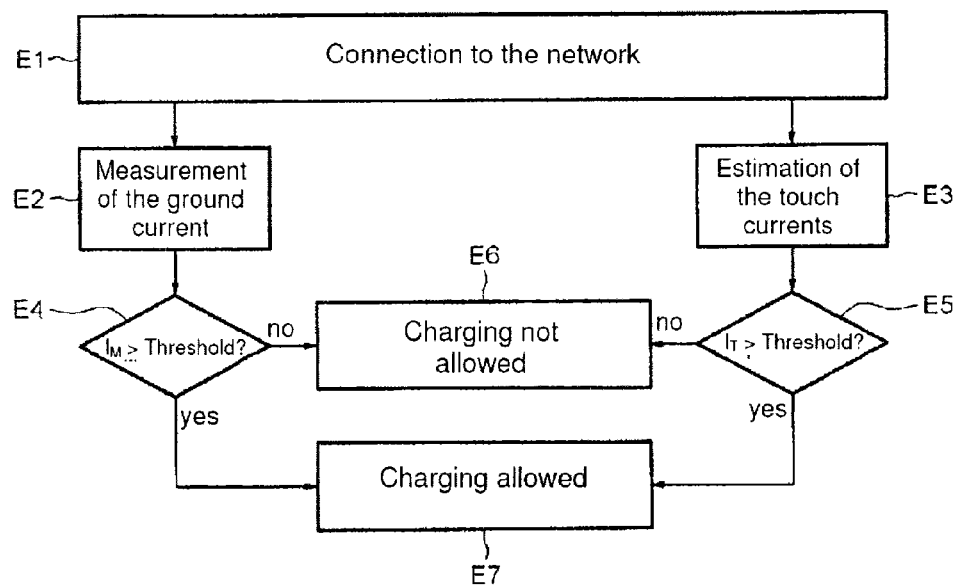
FIG. 3 illustrates the operation of a protection method according to the invention.

FIG. 3 gives details of the various steps used within a device for protecting an electrical apparatus against leakage currents.

These steps are in this instance carried out within an electrical motor vehicle 1 comprising a charger 3.

The charger 3 is connected to an electrical power supply network that may be single-phase or a three-phase during a connection carried out during step E1.

Two steps of measurement and estimation E2 and E3 are then carried out simultaneously. The step E2 corresponds to the measurement of the ground current $I_M$ by the circuit 14. The step E3 corresponds to the estimation of the touch currents $I_T$ by the circuit 9.

The step E2 is followed by a comparison step E4 in which the current $I_M$ is compared with one or more threshold values that are predefined, for example during tests.

For example, if the measured current $I_M$ is below a first threshold value, the quantity of current reaching ground is too weak, which may indicate a ground connection defect. The charging is not allowed during step E6.

If the current $I_M$ is above a second defined threshold value, the quantity of current leaving the charger 3 is sufficient to indicate that there is a ground connection and charging is allowed (step E7).

Step E3 is followed by a comparison step E5 in which the estimated touch current $I_T$ is compared with one or more predefined threshold values.

If the estimated current $I_T$ is below a third predefined threshold value, it is possible to allow charging (step E7); a user may touch the structure 2 without danger.

If the estimated current $I_T$ is above a fourth predefined threshold value, charging is not allowed (step E6).

As above, these third and fourth threshold values may be obtained by prior learning and preferably be set to be equal, to 3.5 mA for example.

The invention provides a device that can be used in any type of unisolated electrical apparatus. The invention allows protection of the users and of the apparatus at all times of its use. Moreover, the protection can be used during a connection to a single-phase network or to a three-phase network.

More precisely, the protection method according to the invention may comprise a step of sending a message, on detection of a touch current $I_T$ that is too great or of a ground current $I_M$ that is too weak, to the power supply network of the electrical apparatus 3 in order to stop the charging of the electrical apparatus 3.

Notably if the electrical apparatus 3 is an electrical vehicle, this message is for example sent from a computer of the vehicle managing the electrical charging of the vehicle, over a communication line called a "pilot line", to the charging terminal supplying the electrical apparatus 3. On receipt of this message, the charging terminal opens a contactor disconnecting the connections 4a, 4b, 4c and 8 of the three-phase or single-phase network hitherto supplying the vehicle.

The invention claimed is:

1. A device for protecting an electrical apparatus against touch currents, the apparatus configured to be connected between an electrical power source and an item of equipment on board a motor vehicle, comprising:
   a circuit detecting leakage currents and estimating touch currents, configured to be connected to electrical connection lines of the apparatus;
   a circuit measuring ground current; and
   a controller which compares an estimated level of the touch currents to predetermined threshold touch currents and which compares a measured level of the ground current to predetermined threshold ground currents, the controller further controlling the supply of electrical power from said electrical power source to said onboard equipment based on a comparison result for the predetermined threshold touch current and a comparison result for the predetermined threshold ground current.

2. The device as claimed in claim 1, wherein the electrical power source includes a three-phase or single-phase power supply network.

3. The device as claimed in claim 1, wherein the electrical apparatus includes a charger for a battery on board the motor vehicle, the electrical motor vehicle being a motor vehicle with an electrical or hybrid drive.

4. A method for protecting an electrical apparatus against touch currents, the apparatus configured to be connected between an electrical power source and an item of equipment on board a motor vehicle, the method comprising:
   detection of leakage currents;
   estimation of touch currents;
   measurement of ground current;

comparison of an estimated touch current to predetermined threshold touch currents;

comparison of a measured ground current to predetermined threshold ground currents; and control of electrical power supplied from said electrical power source to said onboard equipment based on a result of said comparison of an estimated level of the touch currents and based on a result of said comparison of a measured level of the ground current.

5. The method as claimed in claim 4, wherein the electrical apparatus is connected to the electrical power source, and supplying the onboard equipment with electrical power is prevented according to the estimated level of the touch currents and to the measured level of the ground current.

6. The method as claimed in claim 4, further comprising preventing supplying the onboard equipment with electrical power if the measured ground current is below a first threshold value.

7. The method as claimed in claim 4, further comprising allowing supplying the onboard equipment with electrical power if the measured ground current is above a second threshold value.

8. The method as claimed in claim 4, further comprising allowing supplying the onboard equipment with electrical power if the estimation of the touch currents is below a third threshold value.

9. The method as claimed in claim 4, further comprising preventing supplying the onboard equipment with electrical power if the estimation of the touch currents is above a fourth defined threshold value.

10. The method as claimed in claim 5, further comprising stopping supplying the onboard equipment with electrical power by sending a message from the onboard equipment over a communication line to a charging terminal.

11. A method for protecting an electrical apparatus against touch currents, the apparatus configured to be connected between an electrical power source and an item of equipment on board a motor vehicle, the method comprising:

detection of leakage currents;

estimation of touch currents;

measurement of ground current;

control of an operation of the apparatus according to an estimated level of the touch currents and to a measured level of the ground current; and preventing supplying the onboard equipment with electrical power if the measured ground current is below a first threshold value.

12. The method as claimed in claim 11, further comprising allowing supplying the onboard equipment with electrical power if the measured ground current is above a second threshold value.

13. The method as claimed in claim 11, further comprising allowing supplying the onboard equipment with electrical power if the estimation of the touch currents is below a third threshold value.

14. The method as claimed in claim 11, further comprising preventing supplying the onboard equipment with electrical power if the estimation of the touch currents is above a fourth defined threshold value.

15. The method as claimed in claim 11, wherein the electrical apparatus is connected to the electrical power source, and supplying the onboard equipment with electrical power is prevented according to the estimated level of the touch currents and to the measured level of the ground current, and stopping supplying the onboard equipment with electrical power by sending a message from the onboard equipment over a communication line to a charging terminal.

* * * * *